United States Patent
Hatano et al.

(10) Patent No.: US 8,118,585 B2
(45) Date of Patent: Feb. 21, 2012

(54) PATTERN FORMATION METHOD AND A METHOD FOR MANUFACTURING A SEMICONDUCTOR DEVICE

(75) Inventors: Masayuki Hatano, Kanagawa-ken (JP); Suigen Kyoh, Kanagawa-ken (JP); Tetsuro Nakasugi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/882,944

(22) Filed: Sep. 15, 2010

(65) Prior Publication Data

US 2011/0097827 A1    Apr. 28, 2011

(30) Foreign Application Priority Data

Oct. 26, 2009    (JP) ................. 2009-245411

(51) Int. Cl.
*A01J 21/00*    (2006.01)
(52) U.S. Cl. ........ 425/385; 438/703; 438/780; 427/504; 257/E21.024
(58) Field of Classification Search .......... 425/385; 438/703, 780; 427/504; 257/E21.024
See application file for complete search history.

(56) References Cited

U.S. PATENT DOCUMENTS

| 7,247,843 | B1 * | 7/2007 | Moon ................... 250/237 G |
| 2006/0192320 | A1 * | 8/2006 | Tokita et al. ............. 264/293 |
| 2006/0266244 | A1 * | 11/2006 | Kruijt-Stegeman et al. ... 101/485 |
| 2007/0151328 | A1 * | 7/2007 | Kochersperger et al. ..... 73/37.5 |
| 2008/0090170 | A1 * | 4/2008 | Yoneda ................. 430/270.1 |
| 2009/0001634 | A1 * | 1/2009 | Hiroshima ............... 264/447 |
| 2009/0023288 | A1 * | 1/2009 | Jeong et al. ............. 438/670 |
| 2009/0101037 | A1 * | 4/2009 | Suehira et al. ........... 101/484 |

FOREIGN PATENT DOCUMENTS

| JP | 2007-27361 | 2/2007 |
| JP | 2008-78550 | 4/2008 |
| JP | 2008-194980 | 8/2008 |

OTHER PUBLICATIONS

Hatano, "Method of Forming a Template, and Method of Manufacturing a Semiconductor Device Using the Template," U.S. Appl. No. 12/718,370, filed Mar. 5, 2010.

* cited by examiner

*Primary Examiner* — Julia Slutsker
(74) *Attorney, Agent, or Firm* — Finnegan, Henderson, Farabow, Garrett & Dunner, L.L.P.

(57) ABSTRACT

In one embodiment, a pattern formation method is disclosed. The method can place a liquid resin material on a workpiece substrate. The method can press a template against the resin material and measuring distance between a lower surface of a projection of the template and an upper surface of the workpiece substrate. The template includes a pattern formation region and a circumferential region around the pattern formation region. A pattern for circuit pattern formation is formed in the pattern formation region and the projection is formed in the circumferential region. The method can form a resin pattern by curing the resin material in a state of pressing the template. In addition, the method can separate the template from the resin pattern.

18 Claims, 11 Drawing Sheets

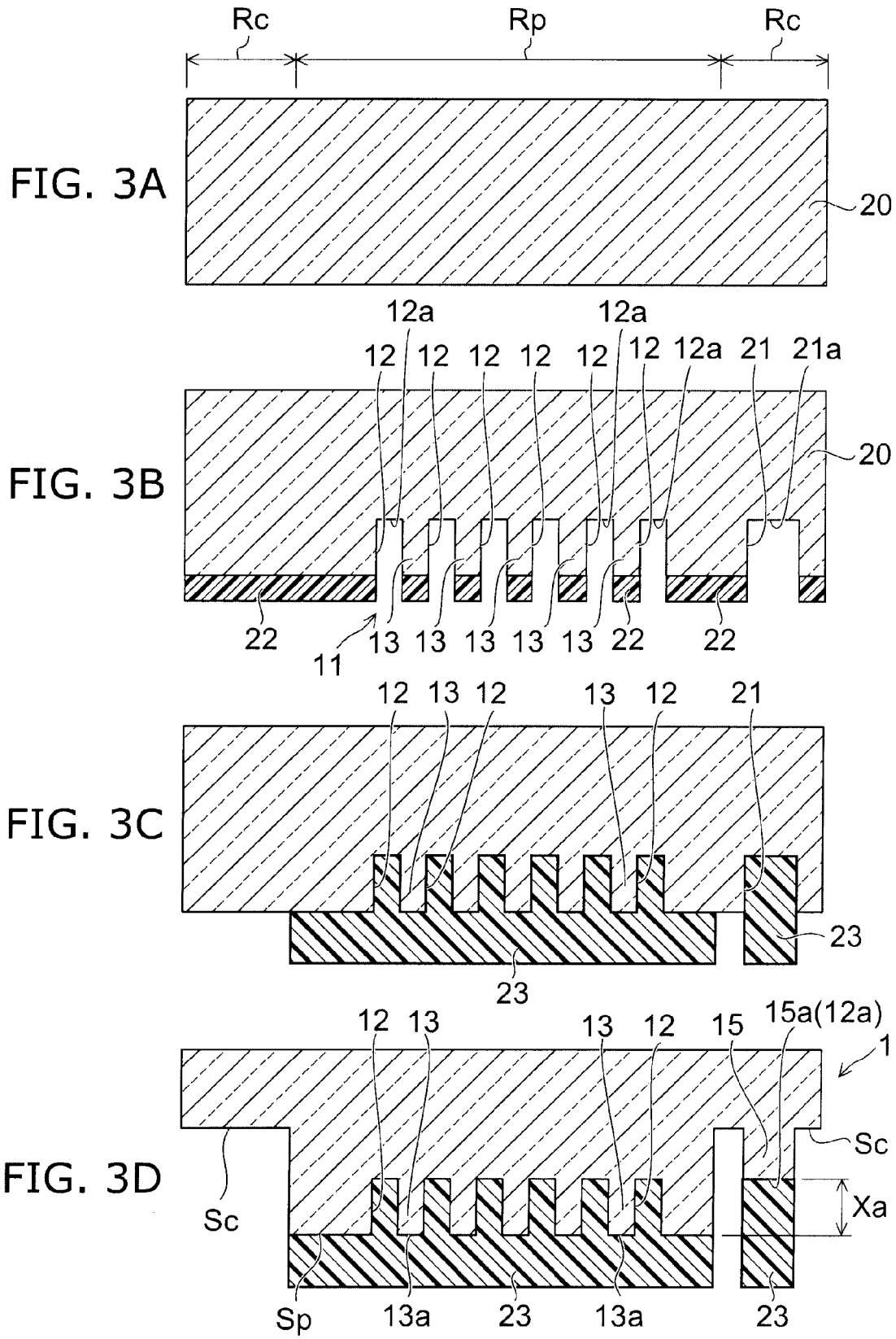

PATTERN FORMATION METHOD AND A METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 2009-245411, filed on Oct. 26, 2009; the entire contents of which are incorporated herein by reference.

FIELD

Embodiments described herein relate generally to a pattern formation method and a method for manufacturing a semiconductor device.

BACKGROUND

In manufacturing a semiconductor device, a fine circuit pattern is formed on the surface of a semiconductor wafer. Conventionally, such a circuit pattern has been formed by a photolithography process. More specifically, a resist film is formed on the wafer. This resist film is exposed to light through a photomask, and then developed. Thus, the pattern formed on the photomask is transferred to the resist film to form a resist pattern. This resist pattern is used as a mask to process the wafer, thereby forming a circuit pattern.

The cost related to the exposure apparatus used in such a photolithography process significantly increases with the miniaturization of the circuit pattern. One reason for this is that the cost of the exposure apparatus itself exponentially increases. In addition, various contrivances are needed in the photomask to obtain resolution comparable to the wavelength of light used. Thus, the cost of the photomask is also rapidly increasing.

As a pattern formation technique to solve this problem, the nanoimprint lithography has been proposed. In the nanoimprint lithography, a pattern to be formed on a wafer is formed beforehand on a template. The template is pressed against a liquid resin material dropped on the wafer. With the template pressed, the resin material is cured. Thus, the pattern made of the resin material is formed (see, e.g., JP-A 2008-194980 (Kokai)). That is, the nanoimprint lithography is a one-to-one transfer technique. Here, the pattern on the template is typically formed by performing EB writing and etching on a template substrate.

The aforementioned nanoimprint lithography is broadly divided into a thermal nanoimprint lithography and an UV-nanoimprint lithography. In the thermal nanoimprint lithography, a resin material is melted by heating. A template is pressed against the melted resin material. Then, the resin material is cured by cooling. On the other hand, in the UV-nanoimprint lithography, a transparent template made of e.g. glass is pressed against a liquid photocurable resin material. Then, this resin material is cured by ultraviolet irradiation.

In the nanoimprint lithography, even in the state of the template pressed against the resin material, the resin material remains between the protrusion of the template and the wafer. The thickness of the layer of this remaining resin material (residual layer) is referred to as residual layer thickness (RLT). The residual layer thickness depends on various conditions, such as the amount of unevenness of the pattern formed on the template, the amount and location of the resist material dropped on the wafer, and the spread state of the resin material pressed by the template. In other words, the residual layer thickness is determined by circumstances. However, the problem is that variation in the residual layer thickness involves variation in the condition for subsequent processing on the wafer. This makes it difficult to perform accurate processing on the wafer.

BRIEF DESCRIPTION OF THE DRAWINGS

FIGS. 3A to 3D are process cross-sectional views illustrating a method for fabricating a template of the first embodiment;

DETAILED DESCRIPTION

In one embodiment, a pattern formation method is disclosed. The method can place a liquid resin material on a workpiece substrate. The method can press a template against the resin material and measuring distance between a lower surface of a projection of the template and an upper surface of the workpiece substrate. The template includes a pattern formation region and a circumferential region around the pattern formation region. A pattern for circuit pattern formation is formed in the pattern formation region and the projection is formed in the circumferential region. The method can form a resin pattern by curing the resin material in a state of pressing the template. In addition, the method can separate the template from the resin pattern.

Embodiments of the invention will now be described with reference to the drawings.

First, a first embodiment of the invention is described.

In the following, a template used in this embodiment is described.

Figure 1:
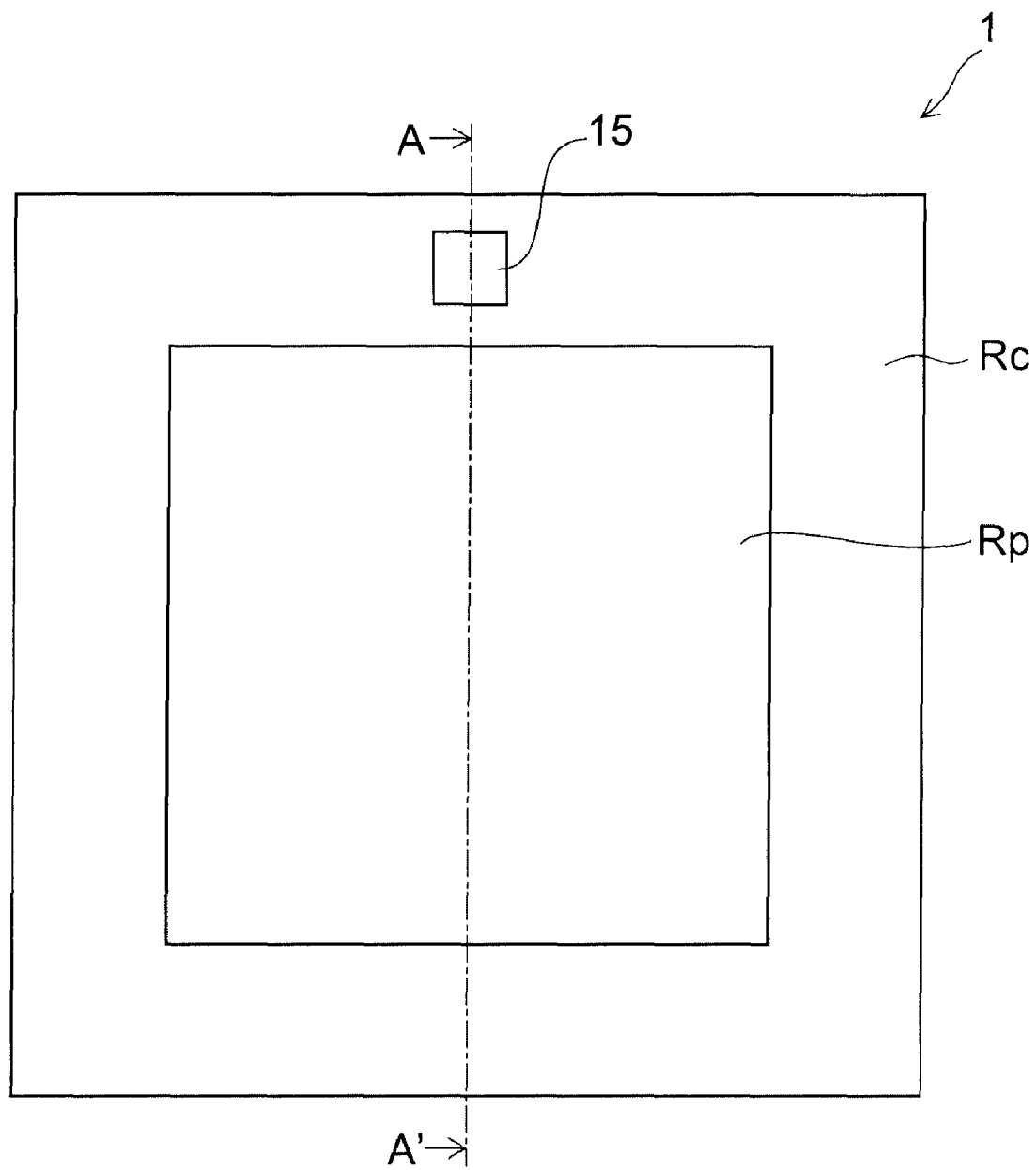
FIG. 1 is a bottom view illustrating a template used in a first embodiment.

FIG. 1 is a bottom view illustrating the template used in this embodiment.

Figure 2:
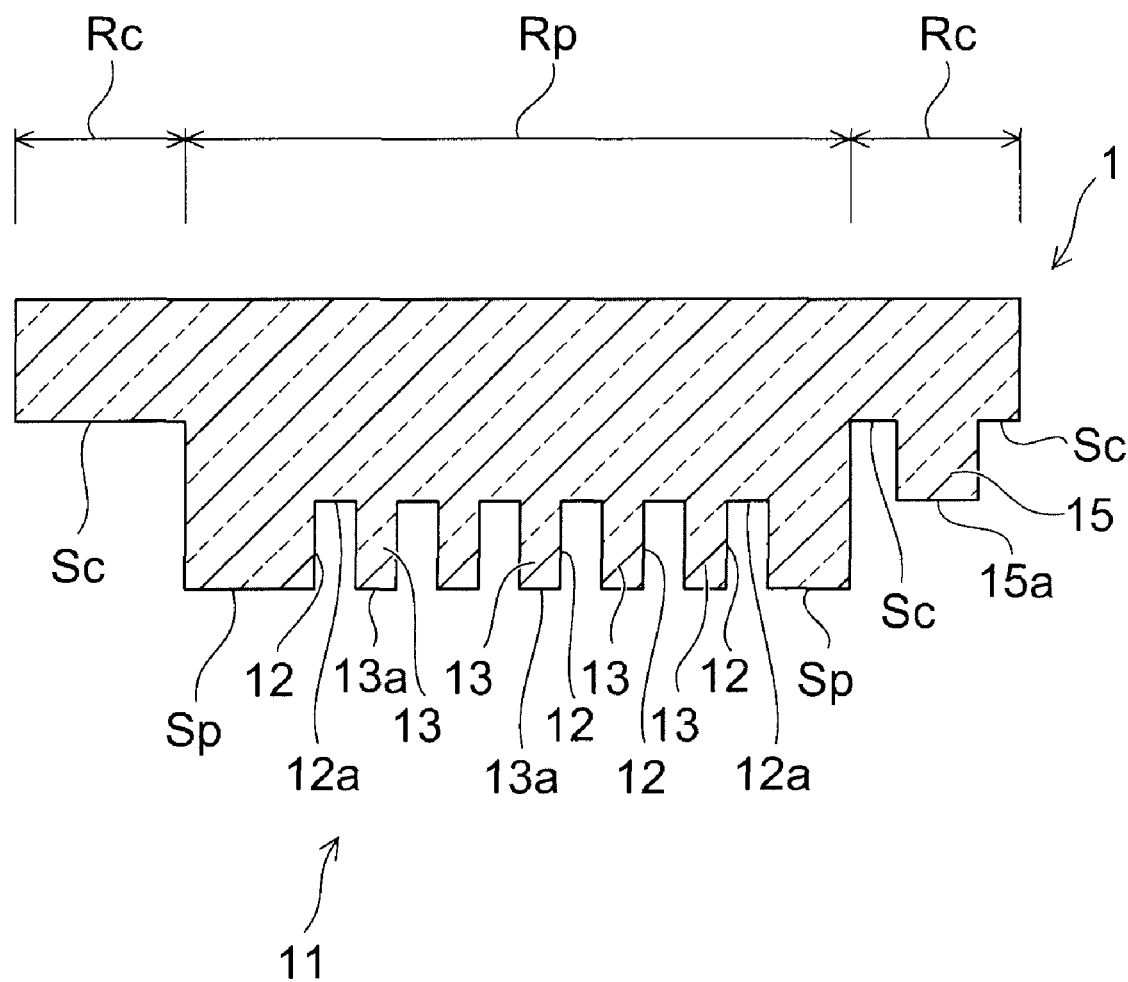
FIG. 2 is a cross-sectional view taken along line A-A' shown in FIG. 1.

FIG. 2 is a cross-sectional view taken along line A-A' shown in FIG. 1.

As shown in FIG. 1, a template 1 used in this embodiment is made of e.g. quartz. Basically, the template 1 is shaped like a rectangular plate. As viewed from the pressing surface (hereinafter referred to as "lower surface") side of the template 1, the central portion of the template 1 constitutes a pattern formation region Rp, which is surrounded by a circumferential region Rc. The pattern formation region Rp is shaped like a rectangle. The circumferential region Rc is shaped like a frame.

As shown in FIG. 2, in the lower surface of the template 1, the circumferential region Rc is recessed relative to the pattern formation region Rp. That is, in the lower surface of the template 1, the region Sc located in the circumferential region Rc is placed above the region Sp located in the pattern formation region Rp. In the pattern formation region Rp, a pattern 11 for forming a circuit pattern of a semiconductor device is formed. In the pattern 11, the lower surface of the template 1 is recessed to form trenches 12. The portion between the trenches 12 constitutes a protrusion 13. Here, in FIG. 1, the pattern 11 is not shown.

In the circumferential region Rc, a projection 15 is formed at one position on the lower surface of the template 1. The projection 15 is shaped like a rectangular solid, for instance. The lower surface 15a of the projection 15 is flat. The lower surface 15a of the projection 15 is located at the same height as the bottom surface 12a of the trench 12. Hence, the lower surface 15a is located above the lower surface 13a of the protrusion 13. In one example, the width of the protrusion 13 is approximately 30 nm. The height of the protrusion 13, i.e., the depth of the trench 12, is approximately 70 to 80 nm.

Next, a method for fabricating the template 1 is described.

FIGS. 3A to 3D are process cross-sectional views illustrating a method for fabricating a template of this embodiment.

First, as shown in FIG. 3A, a substrate 20 made of quartz is prepared. The substrate 20 is shaped like a rectangular plate. In the substrate 20, a pattern formation region Rp and a circumferential region Rc are defined.

Next, as shown in FIG. 3B, an electron beam sensitive resist film is formed on the lower surface of the substrate 20. This resist film is subjected to EB writing, and then developed to form a resist pattern 22. The resist pattern 22 is used as a mask to perform dry etching. Thus, trenches 12 are formed in the pattern formation region Rp. In conjunction therewith, a depression 21 is formed in a region intended for forming a projection 15 (see FIG. 2) in the circumferential region Rc. In the pattern formation region Rp, the remaining portion between the trenches 12 constitutes a protrusion 13. Thus, a pattern 11 is formed. Because the depression 21 is formed by the same dry etching as the trench 12, the depression 21 has the same depth as the trench 12. The bottom surface 12a of the trench 12 and the bottom surface 21a of the depression 21 are flat. Subsequently, the resist pattern 22 is removed.

Next, as shown in FIG. 3C, a resist film 23 is formed so as to cover the overall pattern formation region Rp and the depression 21 in the circumferential region Rc.

Next, as shown in FIG. 3D, the resist film 23 is used as a mask to perform wet etching. Thus, the portion except the depression 21 in the circumferential region Rc is recessed. The recess depth at this time is made deeper than the depth of the trench 12 and the depression 21. Thus, the region Sc located in the circumferential region Rc on the lower surface of the substrate 20 is located above the bottom surface 12a of the trench 12 and the bottom surface 21a of the depression 21. The bottom surface 21a protrudes downward relative to the region Sc. Consequently, a projection 15 is formed at the position where the depression 21 has been formed. The bottom surface 21a of the depression 21 constitutes the lower surface 15a of the projection 15. Subsequently, the resist film 23 is removed.

Next, the vertical distance Xa between the lower surface 13a of the protrusion 13 and the lower surface 15a of the projection 15 is measured. Thus, the template 1 is fabricated.

Next, a method for manufacturing a semiconductor device using the template 1 configured as described above is described.

FIGS. 4A, 4B, 5, 6A to 6C are process cross-sectional views illustrating a pattern formation method according to this embodiment.

Figure 4A:
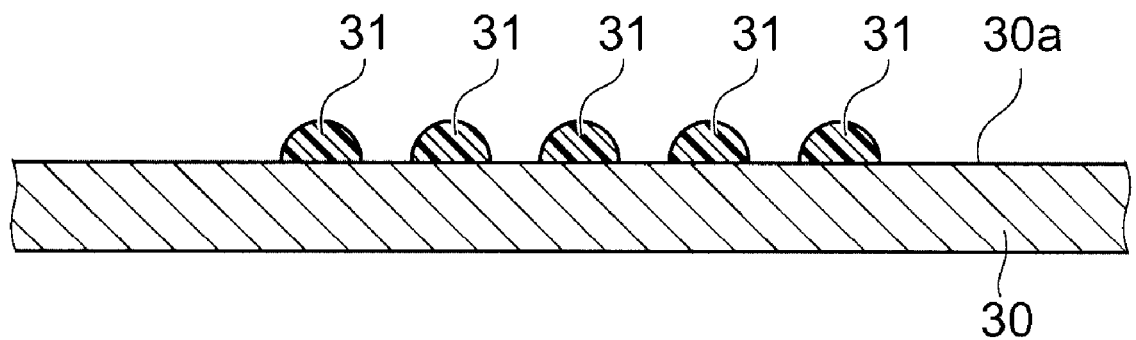
FIGS. 4A and 4B are process cross-sectional views illustrating a pattern formation method according to the first embodiment.

First, as shown in FIG. 4A, a workpiece substrate 30 is prepared. The workpiece substrate 30 may be, for instance, a semiconductor wafer such as a silicon wafer, a semiconductor wafer with a conductive film such as a polysilicon film formed thereon, or a semiconductor wafer with an interlayer insulating film formed thereon.

Next, a liquid resin material 31 is dropped on the upper surface 30a of the workpiece substrate 30. The resin material 31 is a photocurable resin material which is cured by ultraviolet irradiation. Thus, droplets of the resin material 31 are placed at a plurality of positions on the workpiece substrate 30. Here, "liquid" refers to a state of fluidity enough to enable molding by the nanoimprint lithography, and includes the semi-liquid state.

Figure 4B:
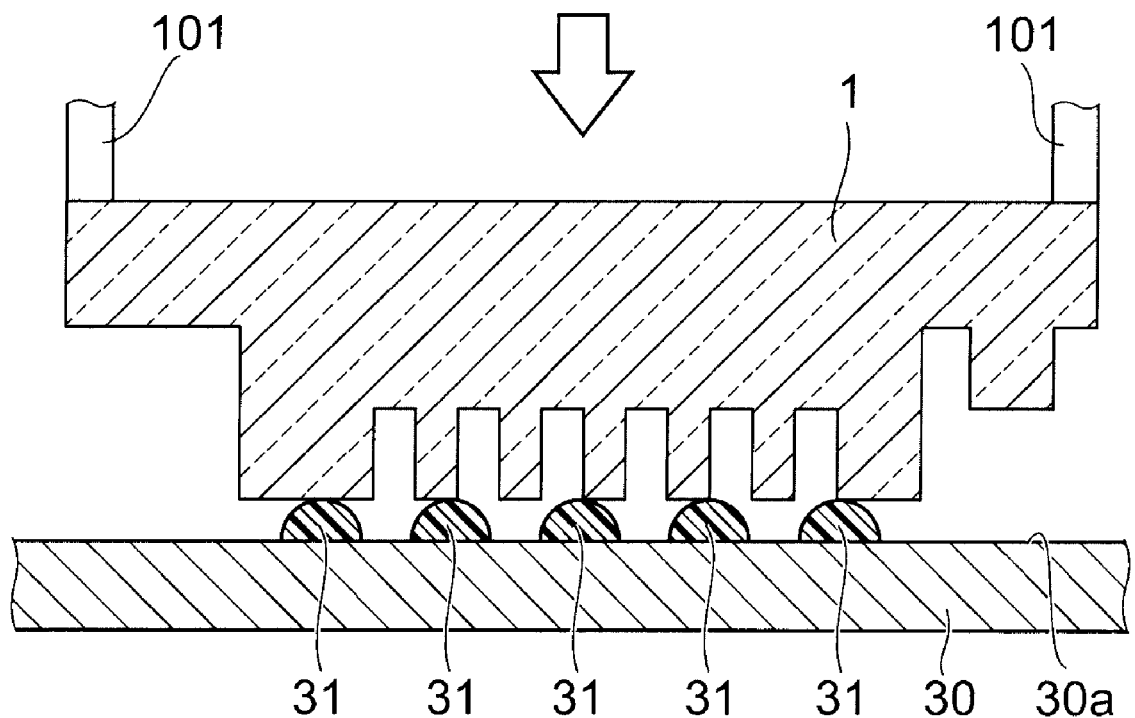

Next, as shown in FIG. 4B, a moving unit 101 holds the template 1, places the template 1 immediately above the workpiece substrate 30, and lowers the template 1 until the template 1 is brought into contact with the droplets of the resin material 31.

Figure 5:
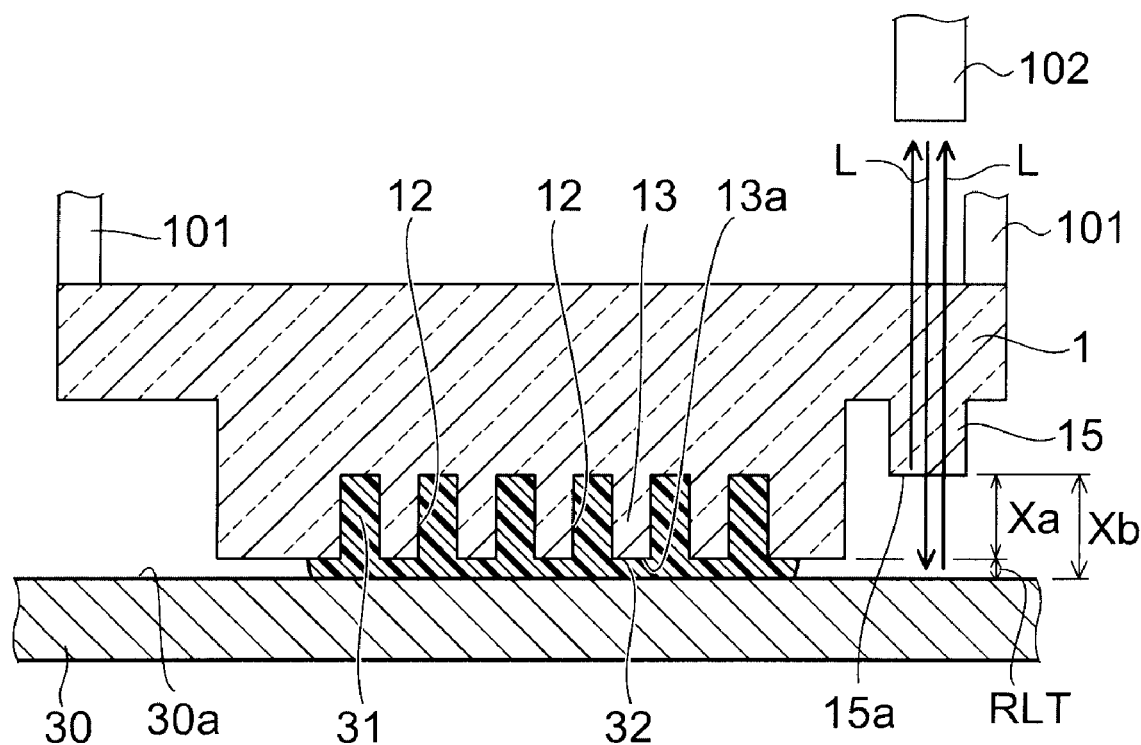
FIG. 5 is a process cross-sectional view illustrating the pattern formation method according to the first embodiment.

Next, as shown in FIG. 5, the template 1 is pressed against the workpiece substrate 30. Thus, the liquid resin material 31 is spread on the workpiece substrate 30, and the trenches 12 are filled therewith. Here, the resin material 31 remains as a residual layer 32 between the lower surface 13a of the protrusion 13 and the upper surface 30a of the workpiece substrate 30. The layer thickness of this residual layer 32, i.e., the distance between the lower surface 13a of the protrusion 13 and the upper surface 30a of the workpiece substrate 30, is the residual layer thickness RLT. The residual layer thickness RLT is determined by the spread state of the resin material 31. The spread state of the resin material 31 depends on the dropped amount and placement of the resin material 31. Hence, even if the template 1 is pressed with the same pressing force, the residual layer thickness RLT varies due to variation in the dropped amount and variation in the dropped position of the resin material 31.

Thus, in this embodiment, with the template 1 pressed downward, the distance Xb between the lower surface 15a of the projection 15 and the upper surface 30a of the workpiece substrate 30 is measured. Specifically, using a laser interferometer 102, the template 1 is irradiated with laser light L from above. Here, the laser light L is injected vertically downward into the template 1 from the upper surface of the template 1 immediately above the projection 15. Thus, the laser light L is transmitted in the template 1, and partly reflected at the lower surface 15a of the projection 15 back to the laser interferometer 102. In conjunction therewith, the rest passes through the lower surface 15a to the upper surface 30a of the workpiece substrate 30 and is reflected at the upper surface 30a. Part of the laser light L reflected at the upper surface 30a again passes through the lower surface 15a of the projection 15 and is transmitted in the template 1 back to the laser interferometer 102. The laser interferometer 102 detects interference between the reflected light from the lower surface 15a of the projection 15 and the reflected light from the upper surface 30a of the workpiece substrate 30 to measure the distance Xb. Furthermore, the residual layer thickness RLT is calculated by the following equation (1).

$$RLT = Xb - Xa \qquad (1)$$

Then, the calculated value of the residual layer thickness RLT is fed back to the moving unit 101 for the template 1. The moving unit 101 stops lowering the template 1 when the residual layer thickness RLT reaches the target value. Thus, the residual layer thickness RLT is made close to the target value. The target value of the residual layer thickness RLT is e.g. 10 nm.

Figure 6A:
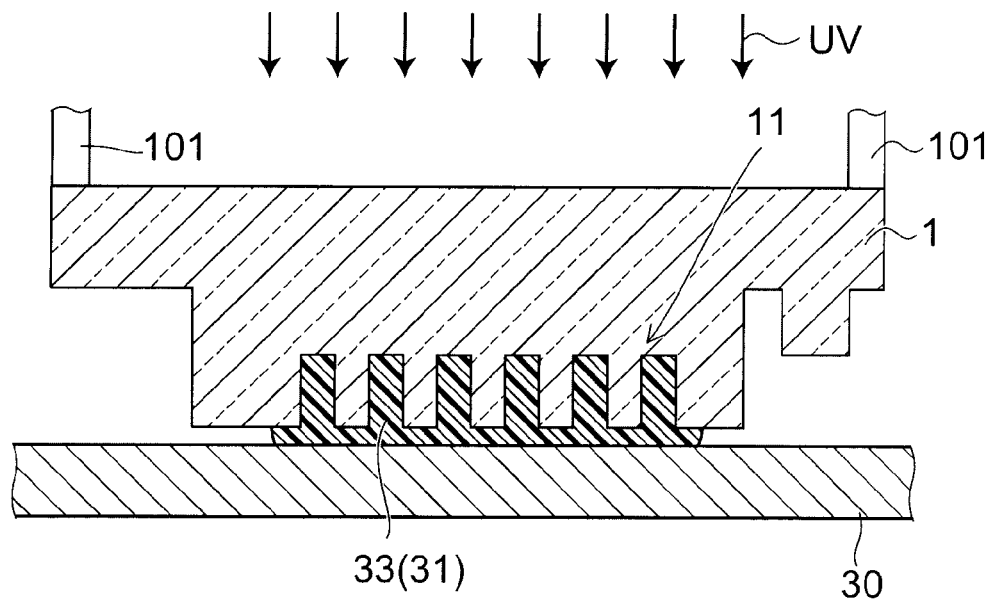
FIGS. 6A to 6C are process cross-sectional views illustrating the pattern formation method according to the first embodiment.

Next, as shown in FIG. 6A, the template 1 is irradiated with ultraviolet radiation UV from above. The ultraviolet radiation UV is transmitted through the template 1 to the resin material 31, and cures the resin material 31. Thus, a resin pattern 33 made of the solid resin material 31 is formed on the workpiece substrate 30. The resin pattern 33 is a transferred pattern of the pattern 11 of the template 1.

Figure 6B:
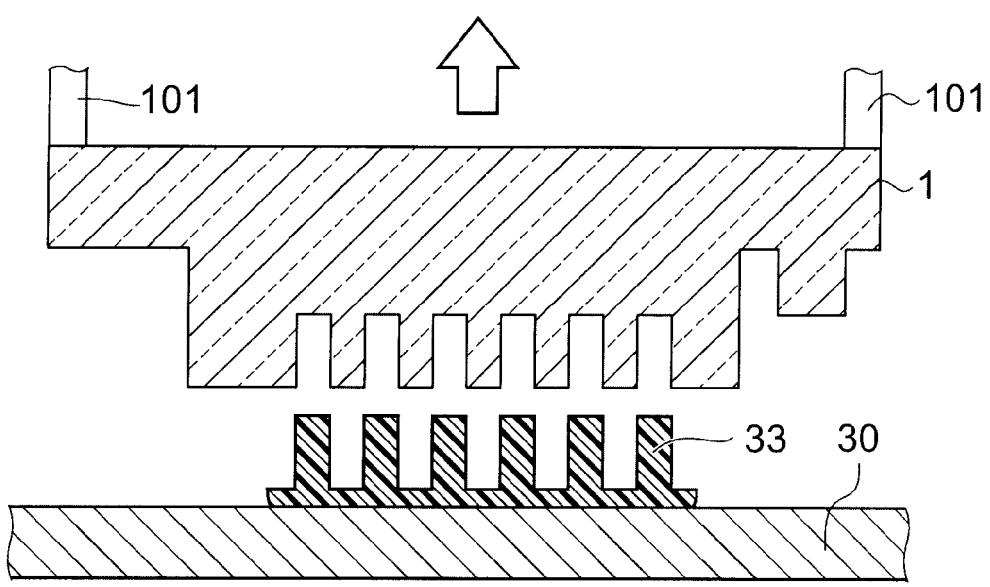

Next, as shown in FIG. 6B, the moving unit 101 moves the template 1 upward and separates the template 1 from the resin pattern 33.

Figure 6C:
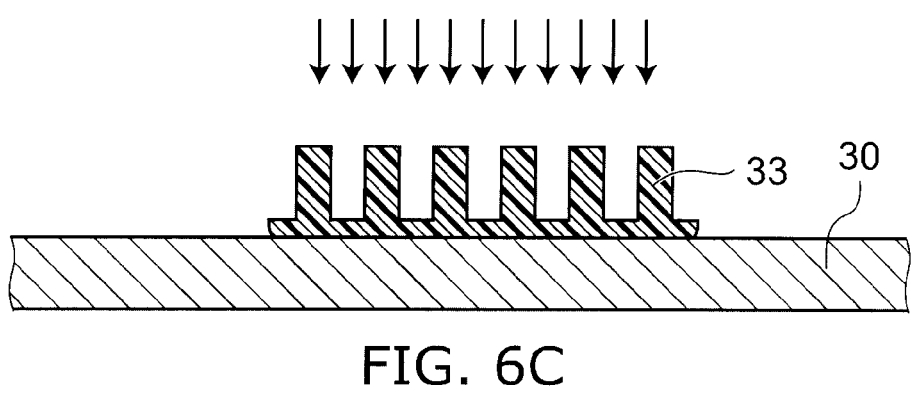

Next, as shown in FIG. 6C, the resin pattern 33 is used as a mask to process the workpiece substrate 30. For instance, the resin pattern 33 is used as a mask to etch the workpiece substrate 30 to process the semiconductor wafer, conductive film, or interlayer insulating film. Alternatively, the resin pattern 33 is used as a mask to implant impurity into the workpiece substrate 30 to form an impurity diffusion layer in the semiconductor wafer. Such processing is repeated to manufacture a semiconductor device.

Next, the effect of this embodiment is described.

In this embodiment, the template 1 is provided with a projection 15. The vertical distance Xa between the lower surface 15a of the projection 15 and the lower surface 13a of the protrusion 13 is measured beforehand. Then, in the process of pressing the template 1 against the resin material 31 shown in FIG. 5, the distance Xb between the lower surface 15a of the projection 15 and the upper surface 30a of the workpiece substrate 30 is measured. Thus, the residual layer thickness RLT can be calculated by the aforementioned equation (1). The calculated value of the residual layer thickness RLT is fed back to the moving unit 101, so that the residual layer thickness RLT can be controlled. Consequently, variation in the residual layer thickness RLT can be suppressed. Thus, in the process shown in FIG. 6C, variation in the condition for processing such as etching can be suppressed. Hence, accurate processing can be performed on the workpiece substrate 30. Thus, a fine semiconductor device can be stably manufactured.

Here, for instance, the following may be considered as a different approach. Without forming a projection 15 on the template, the position of the upper surface (non-pressing surface) of the template is measured when the template is pressed against the resin material 31. Thus, the distance between the upper surface of the template and the upper surface 30a of the workpiece substrate 30 is determined. The residual layer thickness RLT is determined by subtracting the thickness of the template from this distance. However, the thickness of the template has a tolerance on the micron order. On the other hand, the residual layer thickness RLT is approximately 10 nm. Hence, it is extremely difficult to determine the residual layer thickness RLT based on the position of the upper surface of the template.

The following may be considered as another different approach. Without forming a projection 15 on the template, the distance between the region Sc of the lower surface of the template located in the circumferential region Rc and the upper surface 30a of the workpiece substrate 30 is measured by a laser interferometer, for instance. The residual layer thickness RLT is determined by subtracting the recessed amount of the circumferential region Rc from this distance. However, because the recessing of the circumferential region Rc is performed by wet etching, the recessed amount has large variation. Furthermore, because the region Sc is exposed to wet etching, the region Sc has large surface roughness. Thus, this approach is also impractical.

In contrast, according to this embodiment, the lower surface 15a of the projection 15 is formed as the bottom surface 21a of the depression 21 in the process shown in FIG. 3B. The depression 21 has the same depth as the trench 12, such as approximately 70 to 80 nm. Hence, the depth of the depression 21 is considerably smaller than the overall thickness of the template 1, and less prone to errors. Thus, variation in the distance Xa is small. On the other hand, because the projection 15 protrudes downward, the distance Xb between the lower surface 15a of the projection 15 and the upper surface 30a of the workpiece substrate 30 is small. Hence, the measurement of the distance Xb is also less prone to errors. Furthermore, because the depression 21 is formed by dry etching, the bottom surface 21a of the depression 21, i.e., the lower surface 15a of the projection 15, has high flatness. For these reasons, the distance Xb can be accurately measured. Consequently, the residual layer thickness RLT can be accurately determined.

Furthermore, according to this embodiment, the lower surface 15a of the projection 15 is located above the lower surface 13a of the protrusion 13. Thus, for instance, in the case where the workpiece substrate 30 is a semiconductor wafer with a plurality of chip regions defined thereon and the pattern formation region Rp of the template 1 is successively pressed against each chip region, the projection 15 does not crush down the resin pattern 33 already formed in the adjacent chip region.

Furthermore, in this embodiment, in the process shown in FIG. 3B, the depression 21 is formed simultaneously with the trenches 12. In the process shown in FIG. 3C, the depression 21 is also covered with the resist film 23 covering the pattern formation region Rp. Subsequently, the projection 15 is formed by wet etching. Hence, no special process is needed to form the projection 15. Thus, there is no increase in the fabrication cost of the template 1.

In the example described in this embodiment, the measurement value of the residual layer thickness RLT is fed back to the moving unit 101 for the template 1. However, the invention is not limited thereto. For instance, without such feedback, i.e., without controlling the residual layer thickness RLT, the content and condition for the processing on the workpiece substrate 30 shown in FIG. 6C can be adjusted based on the measurement value of the residual layer thickness RLT of the resultant residual layer 32. For instance, in the case where the processing on the workpiece substrate 30 is etching, the etching time may be adjusted based on the residual layer thickness RLT, or the residual layer portion of the resin pattern 33 may be removed before etching. Furthermore, in the case where the processing is impurity implantation, the acceleration voltage may be adjusted based on the residual layer thickness RLT.

Next, a second embodiment of the invention is described.

Figure 7:
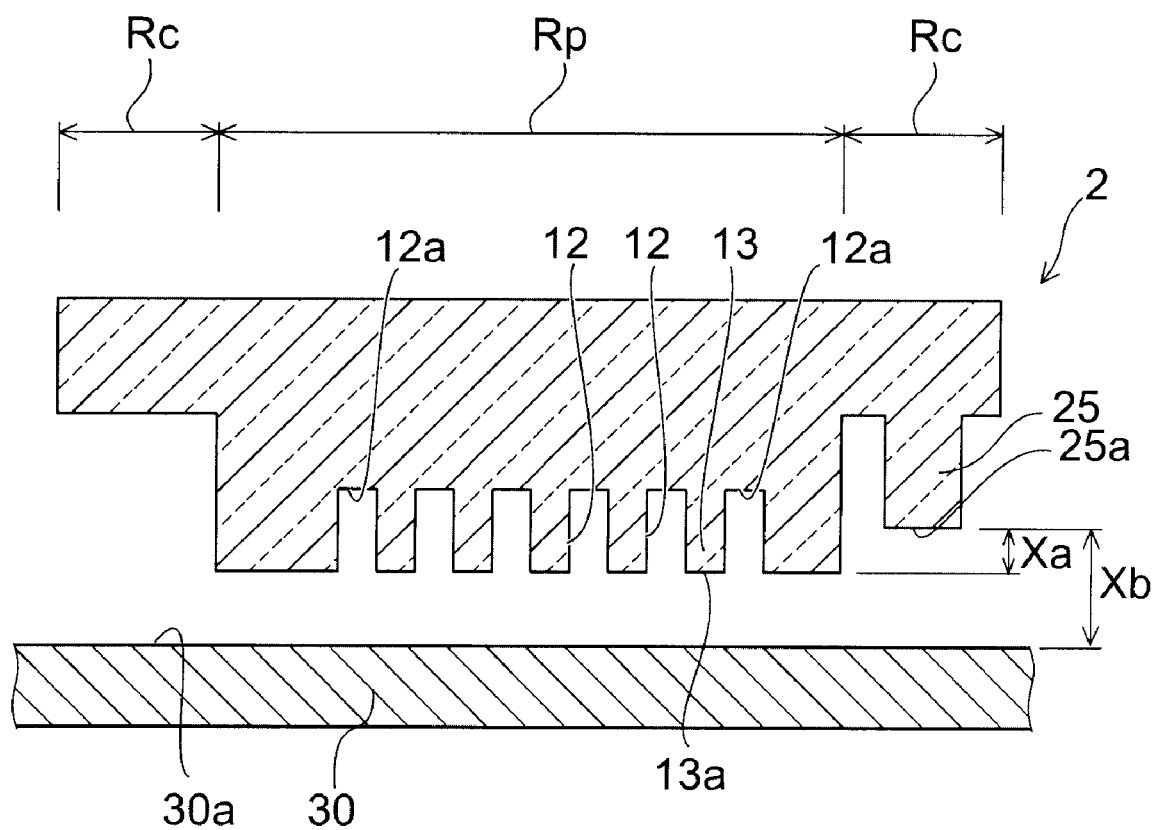
FIG. 7 is a cross-sectional view illustrating a template used in a second embodiment.

FIG. 7 is a cross-sectional view illustrating a template used in this embodiment.

As shown in FIG. 7, a template 2 in this embodiment is different from the template 1 (see FIG. 2) in that the projection 15 is replaced by a projection 25. The projection 25 has a larger amount of protrusion than the projection 15. The lower surface 25a of the projection 25 is located below the bottom surface 12a of the trench 12, and above the lower surface 13a of the protrusion 13. Such a template 2 can be fabricated by forming the trenches 12 and the depression 21 by different etching processes in the process shown in FIG. 3B. According to this embodiment, as compared with the above first embodiment, the position of the lower surface 25a of the projection 25 is lower, and the vertical distance Xa between the lower surface 25a and the lower surface 13a is smaller. Hence, the distance Xb can be measured more accurately. Consequently, the residual layer thickness RLT can be determined more accurately. The configuration and effect of this embodiment other than the foregoing are similar to those of the above first embodiment.

Next, a third embodiment of the invention is described.

Figure 8:
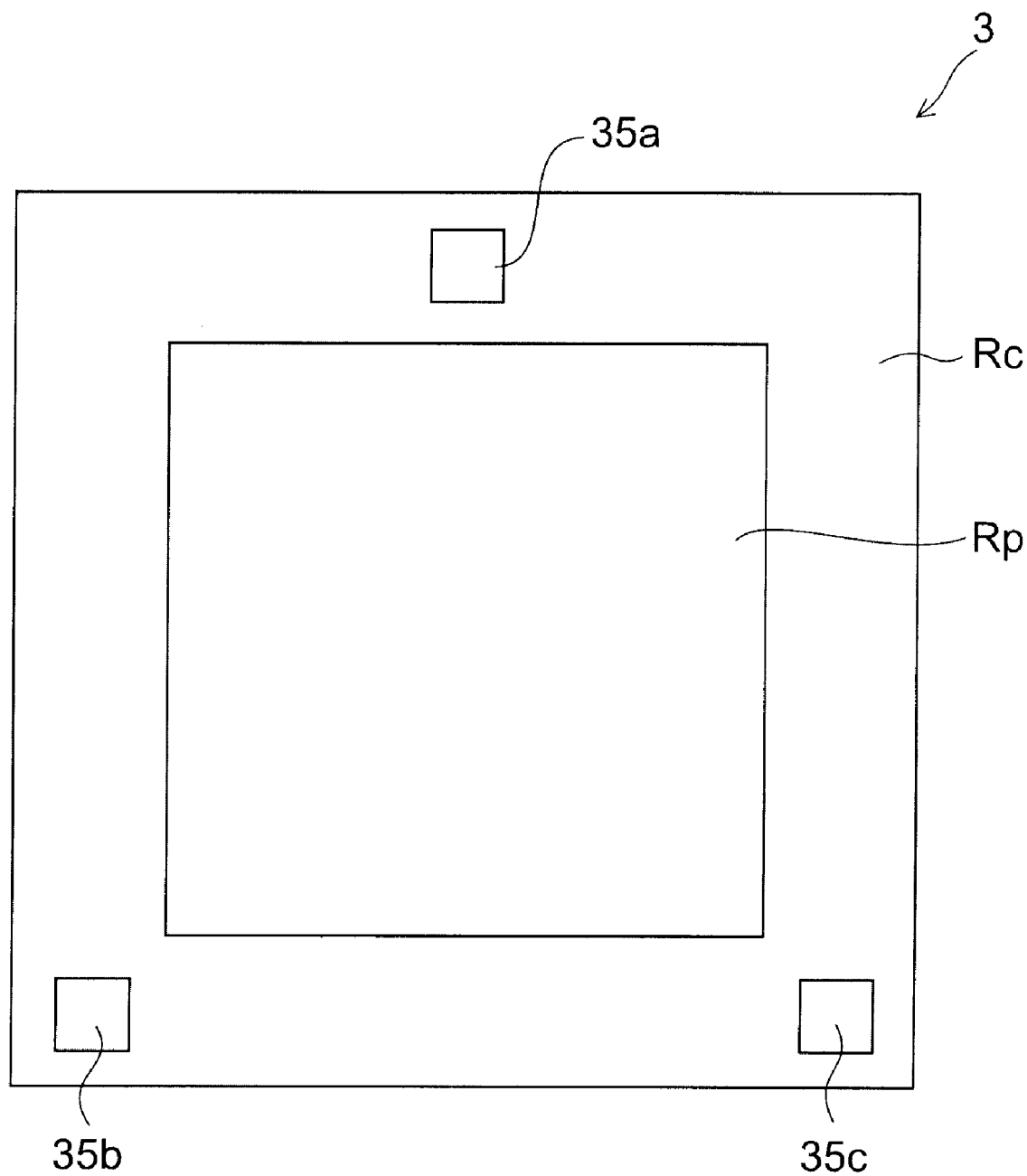
FIG. 8 is a bottom view illustrating a template used in a third embodiment.

FIG. 8 is a bottom view illustrating a template used in this embodiment.

As shown in FIG. 8, in a template 3 in this embodiment, projections 35a, 35b, and 35c are provided at three positions in the circumferential region Rc. The projections 35a, 35b, and 35c are located at non-collinear positions. The lower surfaces of the projections 35a, 35b, and 35c are located at an equal height, and are each flat. That is, the lower surfaces of the projections 35a, 35b, and 35c constitute part of the same imaginary plane.

According to this embodiment, in the process shown in FIG. 5, the distance Xb is measured for each of the projections 35a to 35c. Thus, in addition to the residual layer thickness RLT at each portion, the direction and degree of the inclination of the template 3 with respect to the upper surface 30a of the workpiece substrate 30 can be calculated. Thus, the pitch and roll of the template 3 can be detected to realize triaxial control. The configuration and effect of this embodiment other than the foregoing are similar to those of the above first embodiment. Here, the projections may be formed at four or more positions in the circumferential region Rc.

Next, a fourth embodiment of the invention is described.

Figure 9:
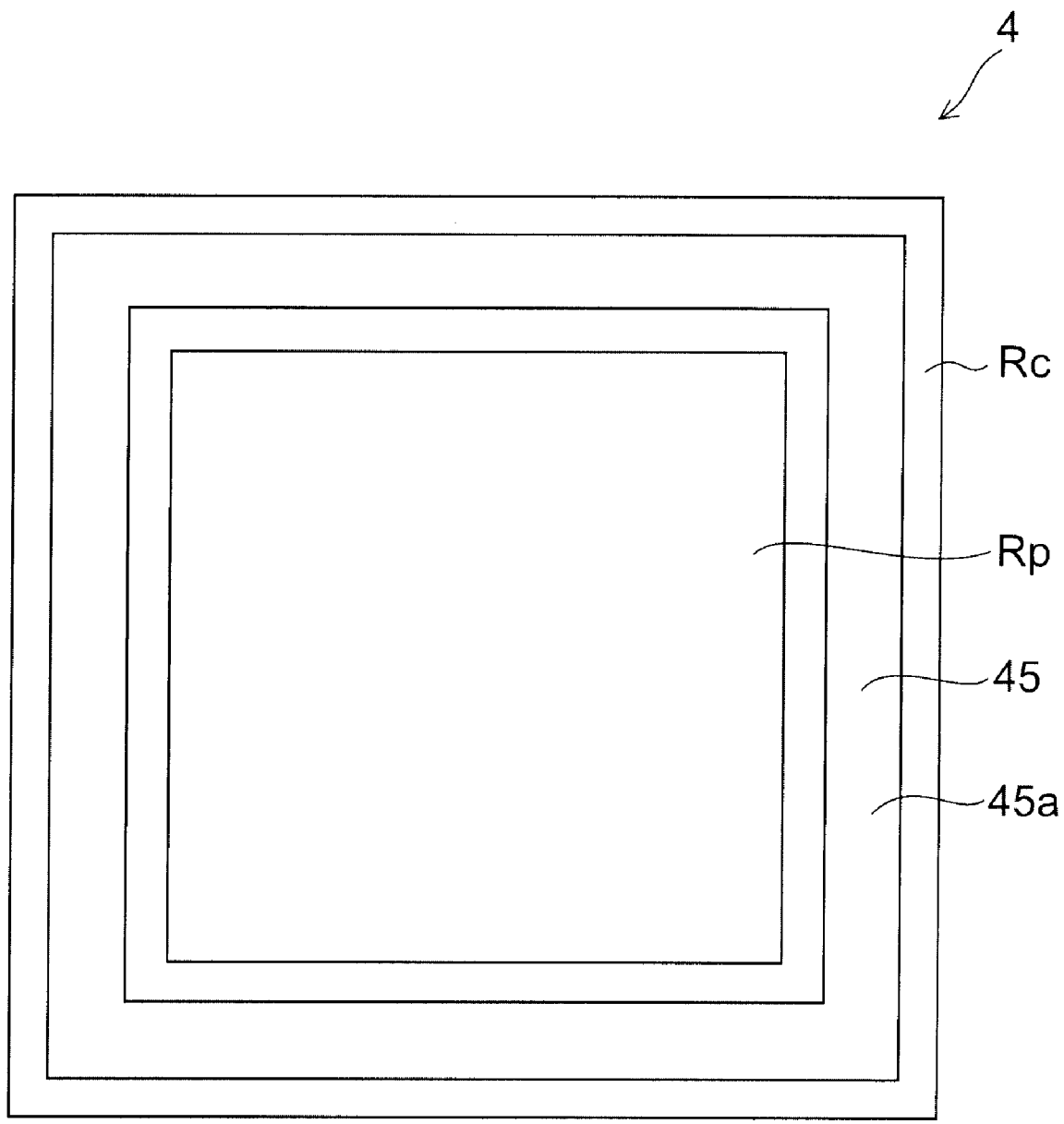
FIG. 9 is a bottom view illustrating a template used in a fourth embodiment.

FIG. 9 is a bottom view illustrating a template used in this embodiment.

As shown in FIG. 9, in a template 4 in this embodiment, a frame-shaped projection 45 is formed in the circumferential region Rc so as to surround the pattern formation region Rp. The lower surface 45a of the projection 45 is flat, and parallel to the lower surface of the pattern formation region Rp. Thus, the distance Xb can be measured at an arbitrary position of the projection 45, allowing multi-axial control. The configuration and effect of this embodiment other than the foregoing are similar to those of the above first embodiment.

Next, a fifth embodiment of the invention is described.

Figure 10A:
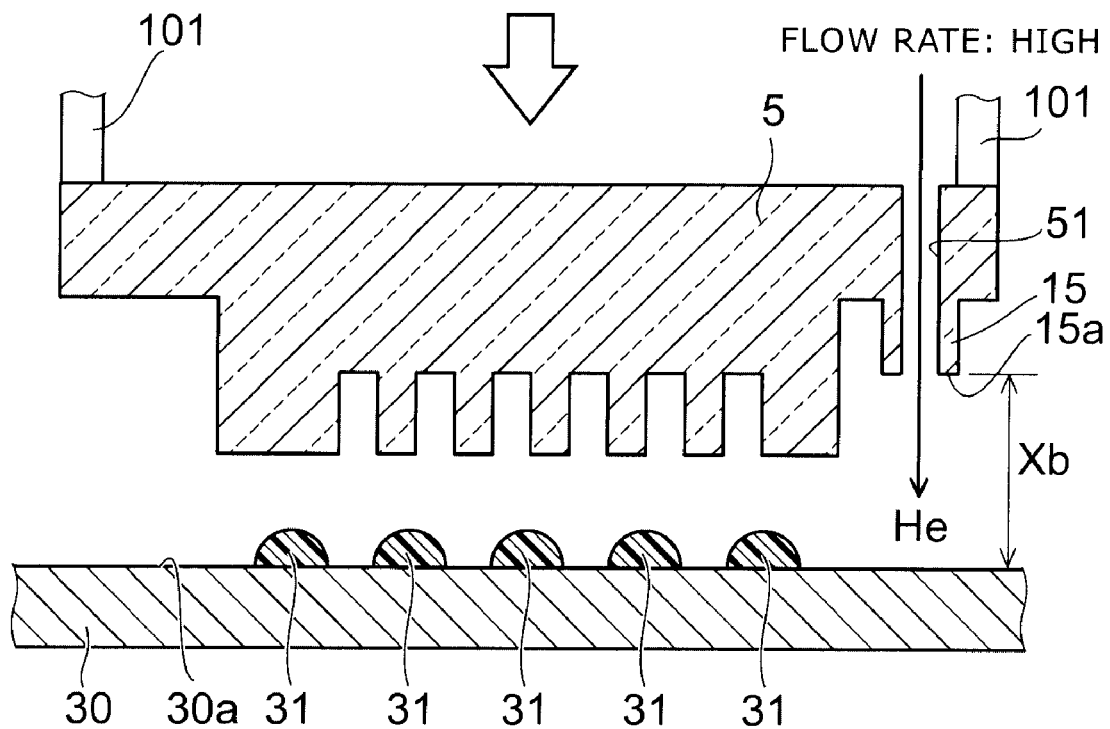
FIGS. 10A and 10B are process cross-sectional views illustrating a pattern formation method according to a fifth embodiment.
Figure 10B:
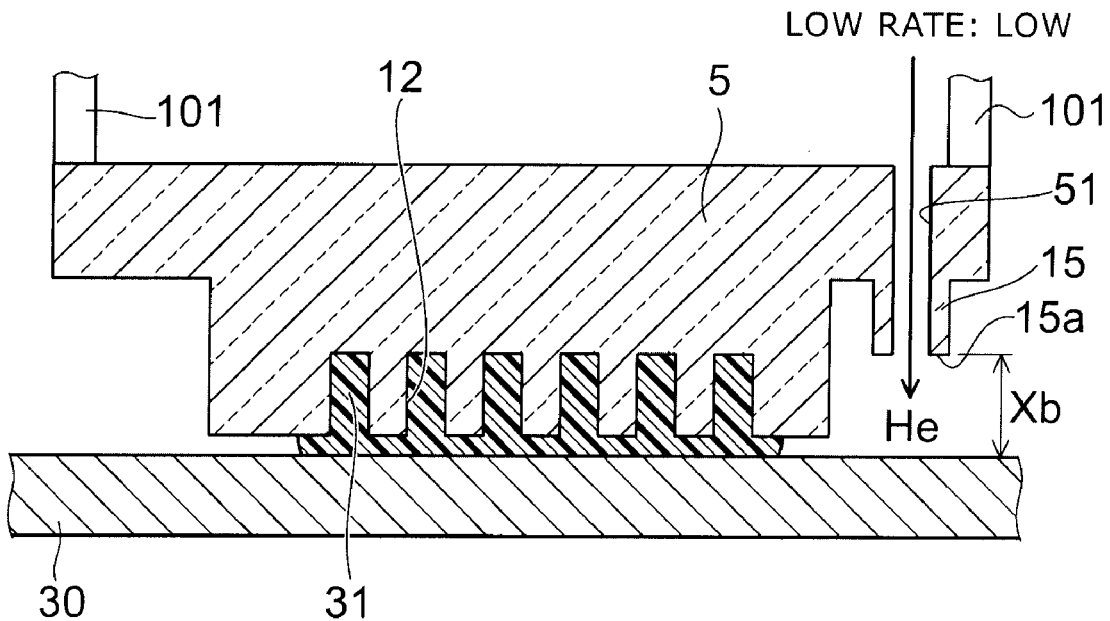

FIGS. 10A and 10B are process cross-sectional views illustrating a pattern formation method according to this embodiment.

As shown in FIGS. 10A and 10B, in a template 5 used in this embodiment, a through hole 51 penetrating through the template 5 is formed at the position corresponding to the projection 15. The lower end of the through hole 51 opens at the lower surface 15a of the projection 15. The upper end of the through hole 51 opens at the upper surface of the template 5 immediately above the projection 15.

In this embodiment, when the template 5 is pressed against the resin material 31, the distance Xb is measured using helium gas instead of the laser interferometer. More specifically, helium gas is passed into the through hole 51 to supply helium gas from above the template 5 into the space between the template 5 and the workpiece substrate 30. Then, the flow resistance of helium gas is evaluated. For instance, with the supply pressure of helium gas kept constant, the flow amount of helium gas is measured.

In this case, as the distance Xb between the template 5 and the workpiece substrate 30 decreases, the resistance to the flow of helium gas increases, and the flow amount of helium gas decreases. Hence, the distance Xb can be estimated by measuring the flow amount of helium gas. Furthermore, by opening the lower end of the through hole 51 at the lower surface 15a of the projection 15, the distance between the lower end of the through hole 51 and the workpiece substrate 30 is made shorter, and the flow resistance is made more sensitive to the distance Xb. Furthermore, by providing a helium gas atmosphere around the resin material 31, helium gas is likely to remain in the trench 12 when the template 5 is pressed against the resin material 31 to fill the trench 12 with the resin material 31. Helium gas has a small molecular size, and is easily diffused in the resin material 31. Hence, as compared with the case where the resin material 31 is surrounded by the ambient atmosphere, air bubbles are less likely to remain in the trench 12. The configuration and effect of this embodiment other than the foregoing are similar to those of the above first embodiment. Here, instead of helium gas, other gases may be used to measure the distance Xb.

Next, a sixth embodiment of the invention is described.

Figure 11A:
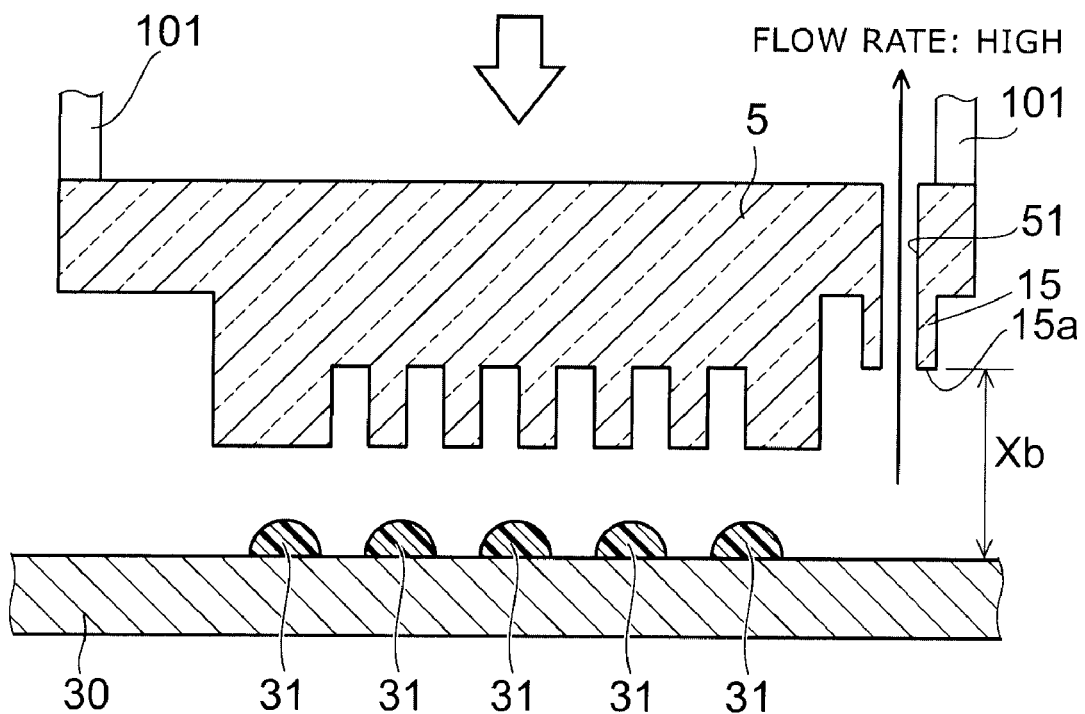
FIGS. 11A and 11B are process cross-sectional views illustrating a pattern formation method according to a sixth embodiment.
Figure 11B:
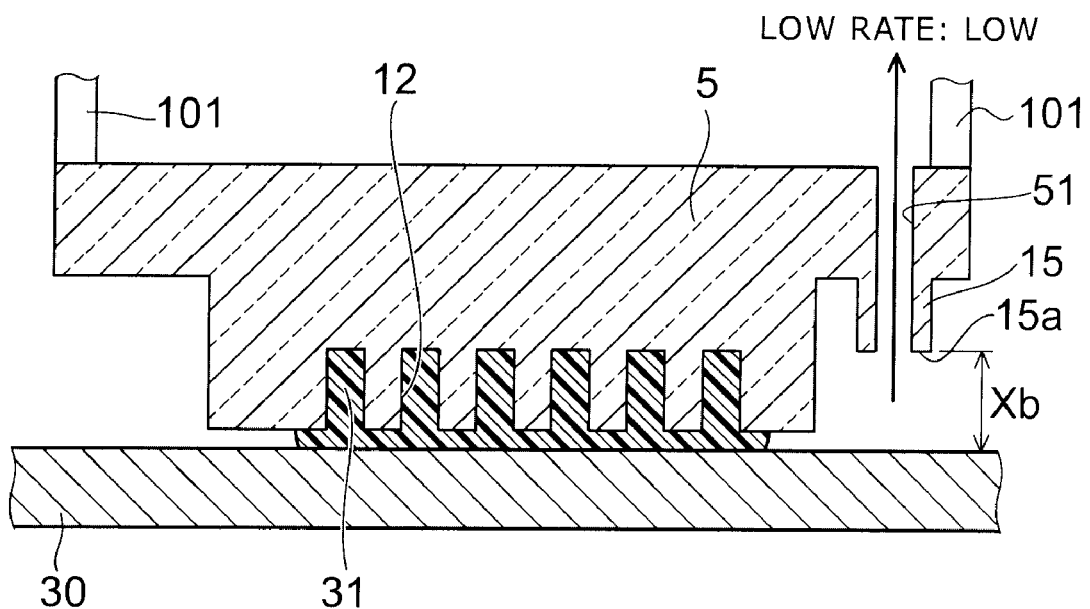

FIGS. 11A and 11B are process cross-sectional views illustrating a pattern formation method according to this embodiment.

As shown in FIGS. 11A and 11B, like the above fifth embodiment, this embodiment also uses the template 5 with the through hole 51 formed therein. However, in this embodiment, instead of supplying helium gas downward through the through hole 51 as in the above fifth embodiment, the atmosphere gas is ejected upward. The atmosphere gas may be either ambient air or helium gas. Then, the flow resistance of the gas flowing in the through hole 51 is evaluated. For instance, with the exhaust pressure kept constant, the flow amount of the gas flowing in the through hole 51 is measured. Also in this case, as in the above fifth embodiment, the distance Xb can be estimated based on the flow resistance of the gas. Furthermore, if the pressure around the resin material 31 is reduced to a vacuum, air bubbles are less likely to remain in the trench 12. The configuration and effect of this embodiment other than the foregoing are similar to those of the above fifth embodiment.

In the examples of the above embodiments, the resin material 31 is a photocurable resin material, and the template is formed from quartz. However, the invention is not limited thereto. For instance, the resin material may be a thermosetting resin material. In this case, the template is formed from a metal, for instance. In the case where the template is formed from a metal, the distance Xb cannot be measured by a laser interferometer as in the above first embodiment. However, in this case, as in the above fifth or sixth embodiment, the distance Xb can be measured by evaluating the flow resistance of a gas. Furthermore, in the examples of the above embodiments, the methods based on a laser interferometer and the methods based on the flow resistance of a gas are used to measure the distance Xb. However, the invention is not limited thereto.

The above embodiments can realize a pattern formation method capable of performing accurate processing on a workpiece substrate and a method for manufacturing a semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions. Moreover, above-mentioned embodiments can be combined mutually and can be carried out.

The invention claimed is:

1. A pattern formation method comprising:
   placing a liquid resin material on a workpiece substrate;
   pressing a template against the resin material and measuring distance between a lower surface of a projection of the template and an upper surface of the workpiece substrate, the template including a pattern formation region and a circumferential region around the pattern formation region, a pattern for circuit pattern formation being formed in the pattern formation region and the projection being formed in the circumferential region;
   forming a resin pattern by curing the resin material in a state of pressing the template; and
   separating the template from the resin pattern, wherein
   in a lower surface of the template, the circumferential region is recessed relative to the pattern formation region, and
   the lower surface of the projection is located above a lower surface of a protrusion of the pattern and at the same height as a bottom surface of a trench of the pattern.

2. The method according to claim 1, further comprising:
   processing the workpiece substrate using the resin pattern as a mask.

3. A pattern formation method comprising:
   placing a liquid resin material on a workpiece substrate;
   pressing a template against the resin material and measuring distance between a lower surface of a projection of the template and an upper surface of the workpiece substrate, the template including a pattern formation region and a circumferential region around the pattern formation region, a pattern for circuit pattern formation being formed in the pattern formation region and the projection being formed in the circumferential region;
   forming a resin pattern by curing the resin material in a state of pressing the template; and
   separating the template from the resin pattern, wherein
   in a lower surface of the template, the circumferential region is recessed relative to the pattern formation region, and
   the lower surface of the projection is located above a lower surface of a protrusion of the pattern and below a bottom surface of a trench of the pattern.

4. The method according to claim 1, wherein in the template, the projection is formed at three or more non-collinear positions in the circumferential region.

5. The method according to claim 1, wherein in the template, the projection is formed so as to surround the pattern formation region.

6. The method according to claim 1, wherein the lower surface of the projection is flat.

7. The method according to claim 1, wherein the measuring of the distance is performed by irradiating the template with laser light from above, allowing the laser light to reach the upper surface of the workpiece substrate through the lower surface of the projection, and detecting interference between reflected light from the lower surface of the projection and reflected light from the upper surface of the workpiece substrate.

8. The method according to claim 1, wherein
   in the template, a through hole penetrating through the template is formed at a position corresponding to the projection, and
   the measuring of the distance is performed by passing a gas in the through hole and evaluating a flow resistance of the gas.

9. The method according to claim 8, wherein the gas is supplied from above the template into a space between the template and the workpiece substrate.

10. The method according to claim 8, wherein the gas is an atmosphere gas and ejected from a space between the template and the workpiece substrate to above the template.

11. A method for manufacturing a semiconductor device, comprising:
    placing a liquid resin material on a workpiece substrate including a semiconductor wafer;
    pressing a template against the resin material and measuring distance between a lower surface of a projection of the template and an upper surface of the workpiece substrate, the template including a pattern formation region and a circumferential region around the pattern formation region, a pattern for circuit pattern formation being formed in the pattern formation region and the projection being formed in the circumferential region;
    forming a resin pattern by curing the resin material in a state of pressing the template;
    separating the template from the resin pattern; and
    processing the workpiece substrate using the resin pattern as a mask, wherein
    in a lower surface of the template, the circumferential region is recessed relative to the pattern formation region, and
    the lower surface of the projection is located above a lower surface of a protrusion of the pattern and at the same height as a bottom surface of a trench of the pattern.

12. The method according to claim 11, wherein the processing of the workpiece substrate includes etching the semiconductor wafer using the resin pattern as a mask.

13. The method according to claim 11, wherein the processing of the workpiece substrate includes implanting impurity into the semiconductor wafer using the resin pattern as a mask.

14. The method according to claim 11, wherein
    the workpiece substrate includes a conductive film provided on the semiconductor wafer, and
    the processing of the workpiece substrate includes etching the conductive film using the resin pattern as a mask.

15. The method according to claim 11, wherein
    the workpiece substrate includes an insulating film provided on the semiconductor wafer, and
    the processing of the workpiece substrate includes etching the insulating film using the resin pattern as a mask.

16. The method according to claim 11, wherein in the template, the projection is formed at three or more non-collinear positions in the circumferential region.

17. The method according to claim 11, wherein in the template, the projection is formed so as to surround the pattern formation region.

18. The method according to claim 11, wherein the measuring of the distance is performed by irradiating the template with laser light from above, allowing the laser light to reach the upper surface of the workpiece substrate through the lower surface of the projection, and detecting interference between reflected light from the lower surface of the projection and reflected light from the upper surface of the workpiece substrate.

* * * * *